(12) United States Patent
Yoon et al.

(10) Patent No.: US 8,771,417 B2
(45) Date of Patent: Jul. 8, 2014

(54) EXHAUST UNIT, EXHAUST METHOD USING THE EXHAUST UNIT, AND SUBSTRATE PROCESSING APPARATUS INCLUDING THE EXHAUST UNIT

(75) Inventors: Song Keun Yoon, Gyeonggi-do (KR); Byoung Gyu Song, Gyeonggi-do (KR); Jae Ho Lee, Gyeonggi-do (KR); Kyong Hun Kim, Seoul (KR)

(73) Assignee: Eugene Technology Co., Ltd., Kyonggi-do (KR)

( * ) Notice: Subject to any disclaimer, the term of this patent is extended or adjusted under 35 U.S.C. 154(b) by 907 days.

(21) Appl. No.: 12/676,519

(22) PCT Filed: Sep. 4, 2008

(86) PCT No.: PCT/KR2008/005210
§ 371 (c)(1),
(2), (4) Date: Mar. 4, 2010

(87) PCT Pub. No.: WO2009/031830
PCT Pub. Date: Mar. 12, 2009

(65) Prior Publication Data
US 2010/0206231 A1 Aug. 19, 2010

(30) Foreign Application Priority Data
Sep. 4, 2007 (KR) .................. 10-2007-0089582

(51) Int. Cl.
*C23C 16/507* (2006.01)
*C23C 16/455* (2006.01)
*C23C 16/50* (2006.01)
*C23F 1/00* (2006.01)
*H01L 21/306* (2006.01)
*C23C 16/22* (2006.01)
*C23C 16/06* (2006.01)

(52) U.S. Cl.
USPC .... 118/715; 118/723 I; 118/728; 156/345.48; 156/345.51; 156/345.33; 156/345.34

(58) Field of Classification Search
USPC .................. 118/715, 723 I, 728; 156/345.48, 156/345.51, 345.33, 345.34
See application file for complete search history.

(56) References Cited

U.S. PATENT DOCUMENTS 4,886,571 A * 12/1989 Suzuki et al. .................. 216/79
5,110,407 A * 5/1992 Ono et al. ..................... 438/696
(Continued)

FOREIGN PATENT DOCUMENTS

JP   08-008239 A   1/1996
JP   11-040398 A   2/1999
(Continued)

OTHER PUBLICATIONS

International Search Report: PCT/KR2008/005210.

*Primary Examiner* — Rudy Zervigon
(74) *Attorney, Agent, or Firm* — Ladas & Parry LLP

(57) ABSTRACT

A substrate processing apparatus includes a chamber having an inner space where a process is carried out with respect to a substrate and an exhaust unit for exhausting substance in the inner space to the outside. The exhaust unit includes a first exhaust plate located at an upstream of an exhaust path of the substance, the first exhaust plate having first exhaust holes, and a second exhaust plate located at a downstream of the exhaust path, the first exhaust plate having second exhaust holes. The first exhaust plate is disposed outside a support member, and the second exhaust plate is disposed below the first exhaust plate generally in parallel to the first exhaust plate. The exhaust unit further includes first covers for selectively opening and closing the first exhaust holes and second covers for selectively opening and closing the second exhaust holes.

13 Claims, 7 Drawing Sheets

(56) References Cited

U.S. PATENT DOCUMENTS

| | | | |
|---|---|---|---|
| 5,393,398 A * | 2/1995 | Sugano | 204/298.11 |
| 5,884,009 A | 3/1999 | Okase | |
| 5,891,350 A * | 4/1999 | Shan et al. | 216/71 |
| 6,036,821 A * | 3/2000 | Warren | 204/192.12 |
| 6,051,100 A | 4/2000 | Walko, II | |
| 6,261,408 B1 * | 7/2001 | Schneider et al. | 156/345.26 |
| 6,531,069 B1 * | 3/2003 | Srivastava et al. | 216/67 |
| 6,963,043 B2 * | 11/2005 | Fink | 219/121.43 |
| 7,416,677 B2 * | 8/2008 | Takahashi | 216/71 |
| 7,648,610 B2 * | 1/2010 | Komiya et al. | 156/345.29 |
| 8,012,305 B2 * | 9/2011 | Takahashi | 156/345.28 |
| 8,075,728 B2 * | 12/2011 | Balakrishna et al. | 156/345.26 |
| 2001/0013504 A1 | 8/2001 | Imafuku et al. | |
| 2002/0038791 A1 * | 4/2002 | Okumura et al. | 216/71 |
| 2003/0094135 A1 * | 5/2003 | Komiya et al. | 118/715 |
| 2005/0167052 A1 * | 8/2005 | Ishihara et al. | 156/345.47 |
| 2005/0244759 A1 | 11/2005 | Lee | |
| 2006/0027328 A1 * | 2/2006 | Benzing et al. | 156/345.47 |
| 2006/0037702 A1 | 2/2006 | Hayashi et al. | |
| 2006/0102286 A1 | 5/2006 | Kim | |
| 2007/0095283 A1 | 5/2007 | Galewski | |
| 2008/0035605 A1 * | 2/2008 | Takahashi | 216/58 |
| 2008/0295964 A1 * | 12/2008 | Takahashi | 156/345.28 |
| 2009/0218043 A1 * | 9/2009 | Balakrishna et al. | 156/345.33 |
| 2010/0206231 A1 * | 8/2010 | Yoon et al. | 118/723.1 |
| 2011/0021034 A1 * | 1/2011 | Yang | 438/758 |

FOREIGN PATENT DOCUMENTS

| | | |
|---|---|---|
| KR | 19990023451 A | 3/1999 |
| KR | 20040033831 A | 4/2004 |
| KR | 20050104917 A | 11/2005 |
| KR | 20060045262 A | 5/2006 |

* cited by examiner

EXHAUST UNIT, EXHAUST METHOD USING THE EXHAUST UNIT, AND SUBSTRATE PROCESSING APPARATUS INCLUDING THE EXHAUST UNIT

TECHNICAL FIELD

The present invention relates to an exhaust unit, an exhaust method using the exhaust unit, and a substrate processing apparatus including the exhaust unit, and, more particularly, to an exhaust unit including exhaust plates, an exhaust method using the exhaust unit, and a substrate processing apparatus including the exhaust unit.

BACKGROUND ART

A semiconductor device has a plurality of layers on a silicon substrate. The layers are deposited on the substrate through a deposition process. The deposition process has several important issues, which are important in evaluating deposited films and selecting a deposition method.

One of the important issues is quality of the deposited films. The quality includes composition, contamination level, defect density, and mechanical and electrical properties. The composition of films may change depending upon deposition conditions, which is very important in obtaining a specific composition.

Another important issue is uniform thickness over a wafer. In particular, the thickness of a film deposited at the top of a nonplanar pattern having a step is very important. Whether the thickness of the deposited film is uniform or not may be determined by a step coverage defined as a value obtained by dividing the minimum thickness of the film deposited at the step part by the thickness of the film deposited at the top of the pattern.

Another issue related to the deposition is space filling, which includes gap filling to fill gaps defined between metal lines with an insulation film including an oxide film. The gaps are provided to physically and electrically insulate the metal lines.

Among the above-described issues, the uniformity is one of the important issues related to the deposition process. A nonuniform film causes high electrical resistance on the metal lines, which increases a possibility of mechanical breakage.

DISCLOSURE OF INVENTION

Technical Problem

It is an object of the present invention to provide an exhaust unit that is capable of securing process uniformity, an exhaust method using the exhaust unit, and a substrate processing apparatus including the exhaust unit.

Other objects of the invention will become more apparent from the following detailed description of the present invention and the accompanying drawings.

Technical Solution

In accordance with one aspect of the present invention, a substrate processing apparatus includes a chamber defining an inner space where a process is carried out with respect to a substrate and an exhaust unit for exhausting substance in the inner space to the outside. The exhaust unit includes a first exhaust plate located at an upstream of an exhaust path of the substance, the first exhaust plate having a plurality of first exhaust holes, and a second exhaust plate located at a downstream of the exhaust path, the first exhaust plate having a plurality of second exhaust holes.

Preferably, the exhaust unit further includes a plurality of first covers for selectively opening and closing the first exhaust holes and a plurality of second covers for selectively opening and closing the second exhaust holes.

Preferably, the substrate processing apparatus further includes a support member disposed in the chamber for supporting the substrate. The first exhaust plate is disposed outside the support member, and the second exhaust plate is disposed below the first exhaust plate generally in parallel to the first exhaust plate.

Preferably, the first exhaust holes include first inside exhaust holes arranged on a concentric circle about a center of the first exhaust plate and first outside exhaust holes disposed outside the first inside exhaust holes, the first outside exhaust holes being arranged on another concentric circle about the center of the first exhaust plate, and the second exhaust holes include second inside exhaust holes arranged on a concentric circle about a center of the second exhaust plate and second outside exhaust holes disposed outside the second inside exhaust holes, the second outside exhaust holes being arranged on another concentric circle about the center of the second exhaust plate.

Preferably, the substrate processing apparatus further includes a support member disposed in the chamber for supporting the substrate, a gas supply unit for supplying a source gas into the inner space, and a coil for inducing an electric field in the inner space to generate plasma from the source gas.

Preferably, the substrate processing apparatus further includes a guide tube disposed above the support member for concentrating the plasma generated in the inner space on the support member.

Preferably, the guide tube has a sectional shape generally corresponding to the shape of the substrate.

Preferably, the chamber includes a process chamber in which the support member is disposed, the process chamber being configured such that the process is carried out by the plasma in the process chamber, and a generation chamber disposed above the process chamber, the generation chamber being configured such that the plasma is generated by the coil in the generation chamber. In this case, the guide tube extends from a top wall of the process chamber to a bottom wall of the process chamber.

Alternatively, the chamber may include a process chamber in which the support member is disposed, the process chamber being configured such that the process is carried out by the plasma in the process chamber, and a generation chamber extending upward from a top wall of the process chamber, the generation chamber being configured such that the plasma is generated by the coil in the generation chamber. In this case, the guide tube may extend from a side wall of the generation chamber to a bottom wall of the process chamber.

Preferably, the substrate processing apparatus further includes a support member disposed in the chamber for supporting the substrate, a gas supply unit for supplying a source gas into the inner space, a coil for inducing an electric field in the inner space to generate plasma from the source gas, a showerhead disposed above the support member in parallel to the support member for supplying the plasma to the substrate placed on the support member, and a support frame for fixing the showerhead to a top of the support member.

Preferably, the first exhaust plate is disposed outside the support member, and the support frame is installed on the first exhaust plate.

In accordance with another aspect of the present invention, an exhaust unit includes a first exhaust plate located at an upstream of an exhaust path, the first exhaust plate having a plurality of first exhaust holes, and a second exhaust plate located at a downstream of the exhaust path, the first exhaust plate having a plurality of second exhaust holes.

In accordance with a further aspect of the present invention, an exhaust method for exhausting substance in a chamber to the outside includes installing a first exhaust plate having a plurality of first exhaust holes at an upstream of an exhaust path of the substance and installing a second exhaust plate having a plurality of second exhaust holes at a downstream of the exhaust path.

Preferably, the exhaust method further includes selectively opening and closing the first exhaust holes using first covers and selectively opening and closing the second exhaust holes using second covers.

Preferably, the exhaust method further includes rotating one of the first and second exhaust plates relative to the other of the first and second exhaust plates by a predetermined angle.

Advantageous Effects

According to the present invention, it is possible to control exhaust, thereby securing process uniformity.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE FOR CARRYING OUT THE INVENTION

Figure 1:
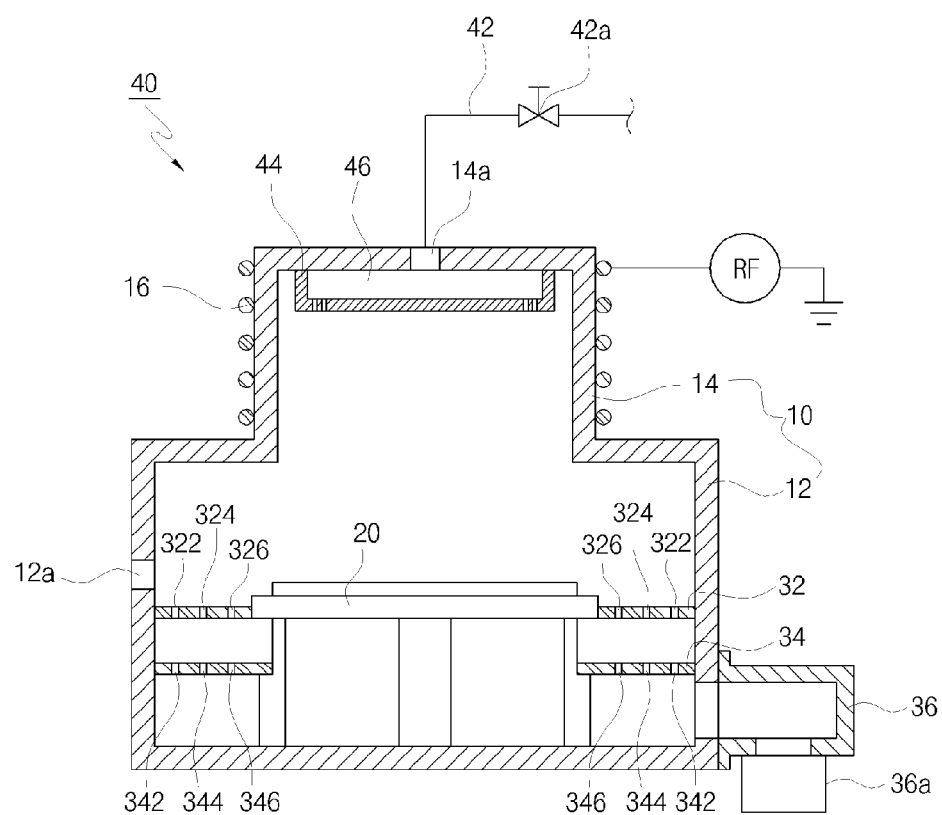
FIG. 1 is a view schematically illustrating a substrate processing apparatus according to a first embodiment of the present invention.

Hereinafter, exemplary embodiments of the present invention will be described in more detail with reference to the accompanying drawings, i.e., FIGS. 1 to 12. Embodiments of the present invention may be modified in various forms, and therefore, the scope of the present invention should not be interpreted to be limited by embodiments which will be described in the following. The embodiments are provided to more clearly describe the present invention to a person having ordinary skill in the art to which the present invention pertains. Consequently, the shape of constituent elements illustrated in the drawings may be exaggerated for more clear description.

Meanwhile, a process using plasma will be described hereinafter as an example, to which, however, the technical concept and scope of the present invention are not limited. For example, the present invention may be applicable to various semiconductor manufacturing apparatuses in which a process is carried out in a vacuum state. Also, an inductively coupled plasma (ICP) type plasma process will be described hereinafter as an example, although the present invention is applicable to various plasma processes including an electron cyclotron resonance (ECR) type plasma process.

FIG. 1 is a view schematically illustrating a substrate processing apparatus according to a first embodiment of the present invention.

The substrate processing apparatus includes a chamber 10 defining an inner space where a process is carried out with respect to a substrate. The chamber 10 includes a process chamber 12 and a generation chamber 14. In the process chamber 12, a process is carried out with respect to the substrate. In the generation chamber 14, plasma is generated from a source gas supplied from a gas supply unit 40, which will be described hereinafter.

In the process chamber 12 is installed a support plate 20. The substrate is placed on the support plate 20. The substrate is introduced into the process chamber 12 through an inlet port 12a formed at one side of the process chamber 12. The introduced substrate is placed on the support plate 20. The support plate 20 may be an electrostatic chuck (E-chuck). Also, a helium (He) rear cooling system (not shown) may be provided to accurately control the temperature of a wafer placed on the support plate 20.

At the outer circumference of the generation chamber 14 is wound a coil 16 which is connected to a radio frequency (RF) generator. When radio-frequency current flows along the coil 16, a magnetic field is induced by the coil. Plasma is generated from a source gas supplied into the chamber 10 by the magnetic field.

The generation chamber 14 is provided at the top wall thereof with a supply hole 14a, to which a supply line 42 is connected. The supply line 42 supplies a source gas into the chamber 10 through the supply hole 14a. The supply line 42 is opened or closed by a valve 42a mounted on the supply line 42. To the top wall of the generation chamber 14 is connected a diffusion plate 44. Between the diffusion plate 44 and the top wall of the generation chamber 14 is defined a buffer space 46. The buffer space 46 is filled with a source gas supplied through the supply line 42. The source gas is diffused into the generation chamber 14 through diffusion holes formed at the diffusion plate 44.

Meanwhile, an exhaust line 36 is connected to one side of the process chamber 12. A pump 36a is mounted on the exhaust line 36. Plasma and reaction by-product generated in the chamber 10 is discharged out of the chamber 10 through the exhaust line 36. At this time, the plasma and the reaction by-product are forcibly discharged by the pump 36a.

The plasma and the reaction by-product in the chamber 10 are introduced into the exhaust line 36 through first and second exhaust plates 32 and 34. The first exhaust plate 32 is disposed outside the support plate 20 such that the first exhaust plate 32 is arranged generally in parallel to the support plate 20. The second exhaust plate 34 is disposed below the first exhaust plate 32 such that the second exhaust plate 34 is arranged generally in parallel to the first exhaust plate 32. The plasma and the reaction by-product in the chamber 10 are introduced into the exhaust line 36 through first exhaust holes 322, 324, and 326 formed at the first exhaust plate 32 and second exhaust holes 342, 344, and 346 formed at the second exhaust plate 34.

Figure 2:
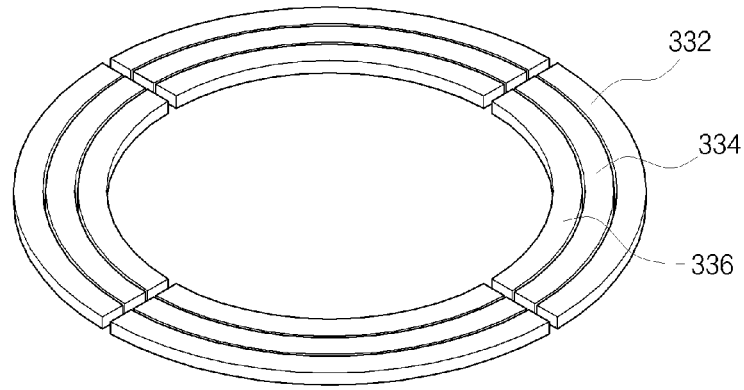
FIG. 2 is a view schematically illustrating a first exhaust plate of FIG. 1.
Figure 2:
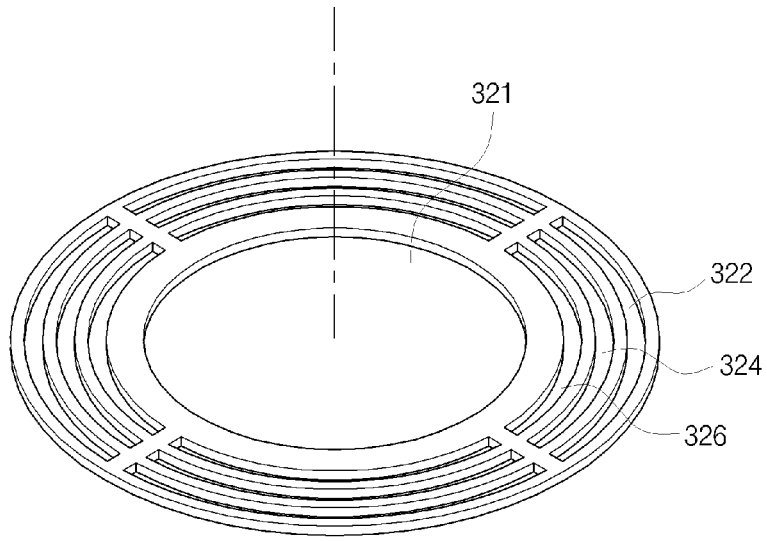

FIG. 2 is a view schematically illustrating the first exhaust plate 32 of FIG. 1. The second exhaust plate 34 and corresponding second covers 352 and 354 have the same structure and function as the first exhaust plate 32 and corresponding first covers 332, 334, and 336, which will be hereinafter described, and therefore, a detailed description of the second exhaust plate 34 and the second covers 352 and 354 will not be given.

As shown in FIG. 2, an opening 321, first outside exhaust holes 322, first middle exhaust holes 324, and first inside exhaust holes 326 are formed at the first exhaust plate 32. The support plate 20 is installed in the opening 321. The first inside exhaust holes 326 are arranged to surround the opening 321 formed at the center of the first exhaust plate 32. That is, the first inside exhaust holes 326 are arranged on a concentric circle about the center of the opening 321. The first middle exhaust holes 324 are arranged to surround the first inside exhaust holes 326. That is, the first middle exhaust holes 324 are arranged on another concentric circle about the center of the opening 321. The first outside exhaust holes 322 are arranged to surround the first middle exhaust holes 324. That is, the first outside exhaust holes 322 are arranged on another concentric circle about the center of the opening 321.

As shown in FIG. 2, the first outside exhaust holes 322 may be opened or closed by first outside covers 332. The first middle exhaust holes 324 may be opened or closed by first middle covers 334. The first inside exhaust holes 326 may be opened or closed by first inside covers 336. The first outside exhaust holes 322 have size and shape corresponding to those of the first outside covers 332. The first middle exhaust holes 324 have size and shape corresponding to those of the first middle covers 334. The first inside exhaust holes 326 have size and shape corresponding to those of the first inside covers 336.

Figure 3:
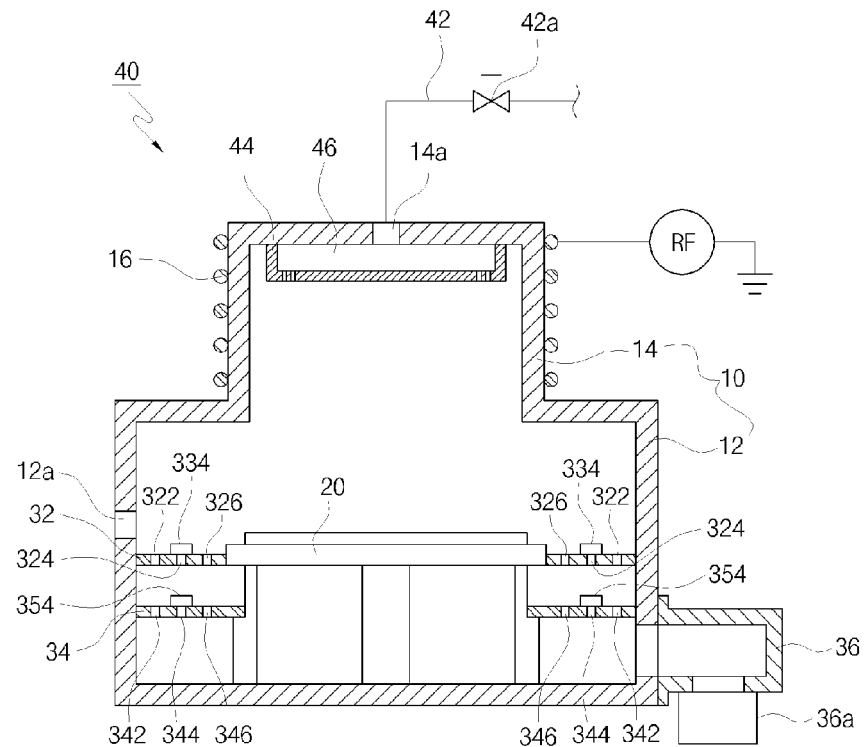
FIGS. 3 and 4 are views illustrating selectively closing exhaust holes formed at the first exhaust plate of FIG. 1.
Figure 4:
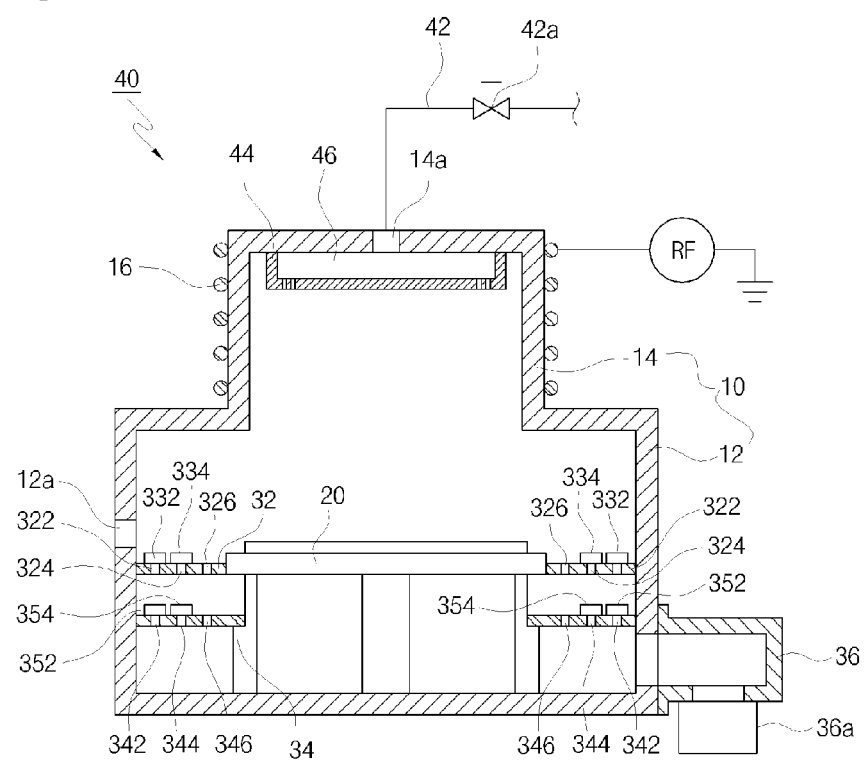
Figure 5:
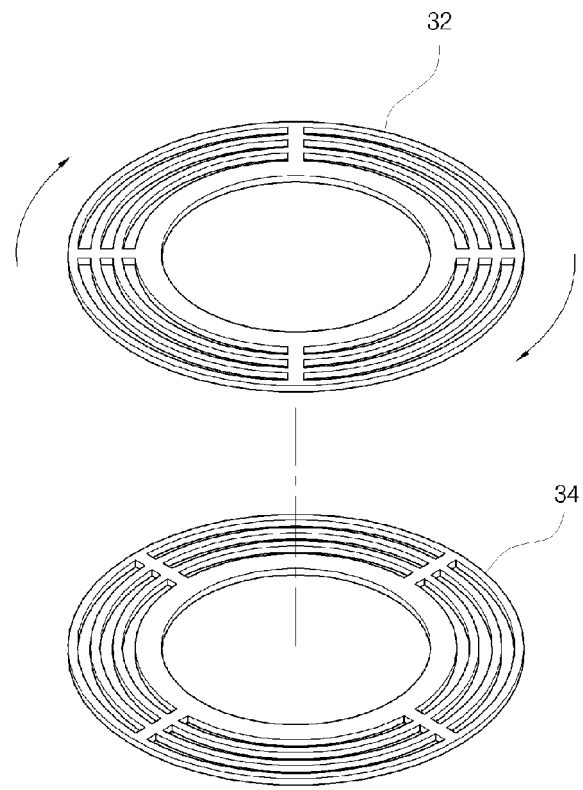
FIG. 5 is a view illustrating controlling process uniformity using the first exhaust plate and a second exhaust plate of FIG. 1.

FIGS. 3 and 4 are views illustrating selectively closing the exhaust holes formed at the first exhaust plate of FIG. 1, and FIG. 5 is a view illustrating controlling process uniformity using the first exhaust plate 32 and the second exhaust plate 34 of FIG. 1. Hereinafter, a method of controlling process uniformity will be described with reference to FIGS. 3 to 5.

A process with respect to the substrate in the inner space of the chamber 10 is performed using plasma, and process uniformity is secured by controlling the flow of the plasma. Plasma generated in the chamber 10 is introduced into the exhaust line 36 through the first and second exhaust plates 32 and 34. Consequently, it is possible to control the flow of the plasma using the first and second exhaust plates 32 and 34.

FIG. 3 illustrates the first and second middle exhaust holes 324 and 344 being closed by the first and second middle covers 334 and 354. FIG. 4 illustrates the first and second middle exhaust holes 324 and 344 and the first and second outside exhaust holes 322 and 342 being closed by the first and second middle covers 334 and 354 and the first and second outside covers 332 and 352, respectively. The plasma is introduced into the exhaust line 36 through the respective exhaust holes formed at the first and second exhaust plates 32 and 34. Consequently, it is possible to control flow area by selectively closing the exhaust holes, thereby controlling the flow of the plasma.

Meanwhile, in FIGS. 3 and 4, the exhaust holes of the first and second exhaust plates 32 and 34 are closed under the same condition; however, the closing condition of the first and second exhaust plates 32 and 34 may be changed. For example, some of the first outside exhaust holes 322 may be selectively opened or closed. Alternatively, some of the first inside exhaust holes 326 may be selectively opened or closed. That is, it is possible to control the flow of the plasma by selectively using the first covers, the number of which is 12, shown in FIG. 2, whereby it is possible to secure process uniformity according to the results of the process.

Alternatively, as shown in FIG. 5, one of the first and second exhaust plates 32 and 34 may be rotated relative to the other of the first and second exhaust plates 32 and 34 to adjust the relative positions between the first exhaust holes and the second exhaust holes. That is, the first exhaust holes and the second exhaust holes may be arranged, such that the first exhaust holes and the second exhaust holes are not aligned to each other, to control the flow of the plasma.

As described above, it is possible to control the flow of the plasma using the first and second exhaust plates, thereby securing process uniformity.

Mode for the Invention

Figure 6:
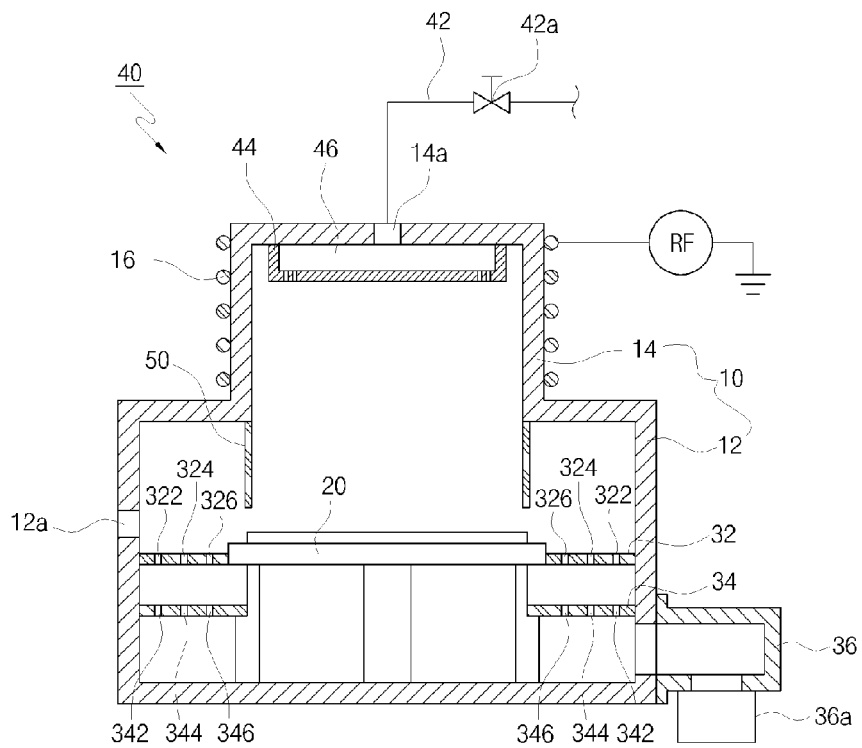
FIG. 6 is a view schematically illustrating a substrate processing apparatus according to a second embodiment of the present invention.

FIG. 6 is a view schematically illustrating a substrate processing apparatus according to a second embodiment of the present invention. As shown in FIG. 6, the substrate processing apparatus further includes a guide tube 50.

The guide tube 50 has a cross sectional shape generally corresponding to the shape of the substrate. For example, when the substrate is rectangular, the guide tube 50 has a rectangular shape in cross section. When the substrate is circular, the guide tube 50 has a circular shape in cross section. The guide tube 50 extends from the top wall of the process chamber 12 and the lower end of the generation chamber 14 toward the support plate 20. The lower end of the guide tube 50 is spaced a predetermined distance from the support plate 20. Consequently, it is possible for plasma to be introduced into the exhaust line 36 through a gap defined between the lower end of the guide tube 50 and the support plate 20.

As shown in FIG. 6, plasma generated in the generation chamber 14 may concentrated on the substrate placed at the top of the support plate 20 through the inner wall of the guide tube 50. When the guide tube 50 is not provided, some of the plasma may flow outside the substrate without the reaction with the substrate.

Figure 7:
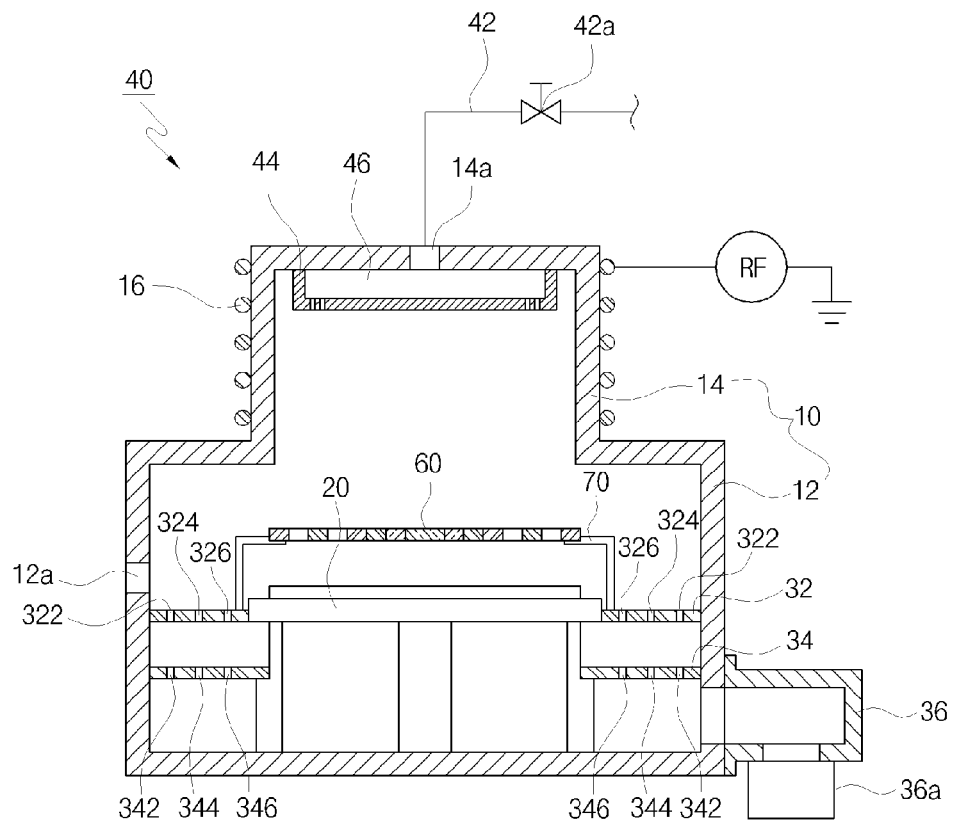
FIG. 7 is a view schematically illustrating a substrate processing apparatus according to a third embodiment of the present invention.

FIG. 7 is a view schematically illustrating a substrate processing apparatus according to a third embodiment of the present invention. The substrate processing apparatus further includes a showerhead 60 and a support frame 70. The showerhead 60 is disposed above the support plate 20 such that the showerhead 60 is spaced a predetermined distance from the support plate 20. The showerhead 60 is placed at the upper end of the support frame 70. The lower end of the support frame 70 is connected to the top of the first exhaust plate 32. The support frame 70 supports the showerhead 60 and, at the same time, protects the support plate 20 and a heater (not shown) mounted in the support plate 20.

Figure 8:
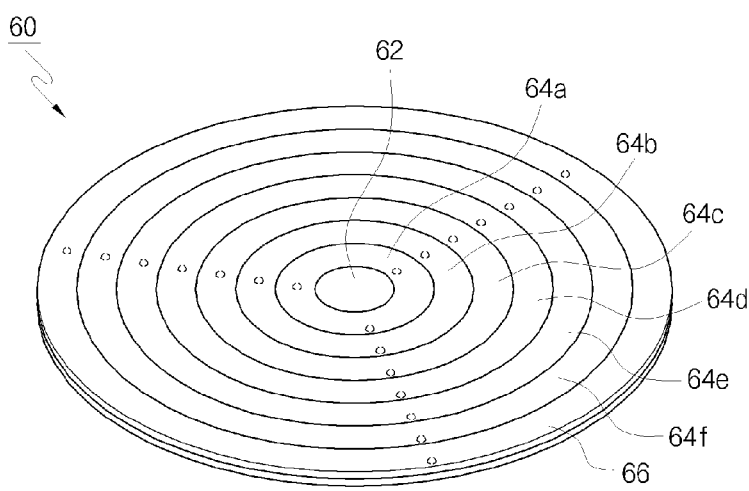
FIGS. 8 to 10 are views illustrating a showerhead of FIG. 6.
Figure 9:
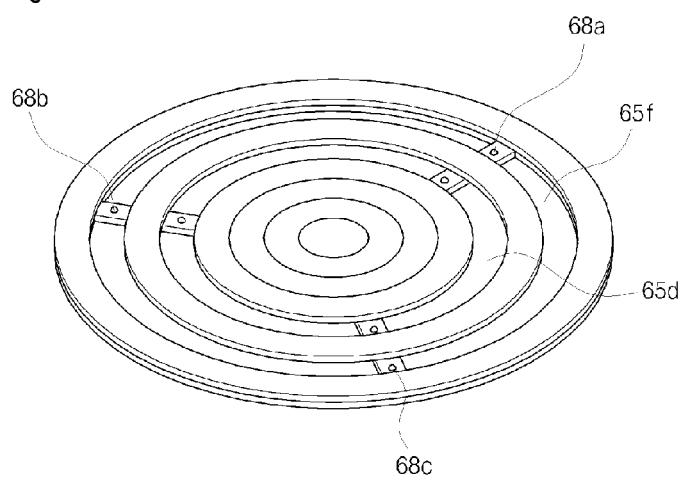
Figure 10:
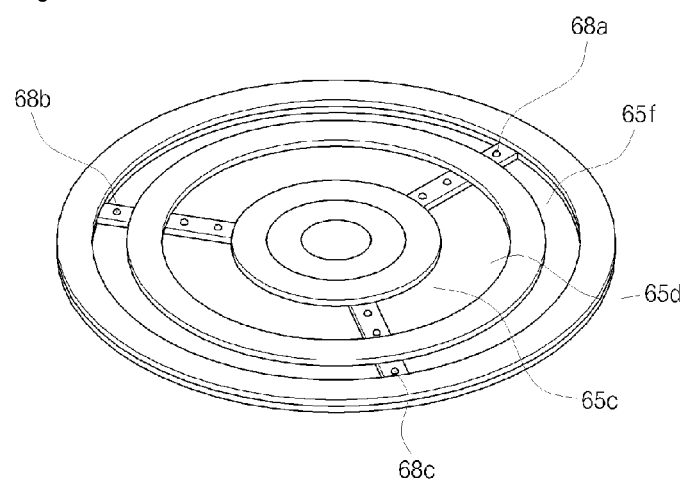

FIGS. 8 to 10 are views illustrating the showerhead 60 of FIG. 7. The showerhead 60 includes a central plate 62, a boundary plate 66, and connection bars 68 interconnecting the central plate 62 and the boundary plate 66. The showerhead 60 supplies plasma generated in the generation chamber 14 to the substrate placed on the support plate 20. The connection bars 68a, 68b, and 68c are arranged about the central plate 62 at angular intervals of 120 degrees.

As shown in FIGS. 8 and 9, the central plate 62 is located at the center of the showerhead 60, and the connection bars 68 extend outward from the central plate 62 in the radial direction. The ring-shaped boundary plate 66 is connected to one end of each connection bar 68. Between the central plate 62 and the boundary plate 66 are interposed first to sixth rings 64a, 64b, 64c, 64d, 64e, and 64f. The first to sixth rings 64a, 64b, 64c, 64d, 64e, and 64f may be separably connected to the connection bars 68.

FIG. 9 illustrates the fourth and sixth rings 64d and 64f being separated from the connection bars 68. When the fourth and sixth rings 64d and 64f are separated from the connection bars 68, fourth and sixth spray ports 65d and 65f corresponding to the fourth and sixth rings 64d and 64f are provided. FIG. 10 illustrates the third, fourth, and sixth rings 64c, 64d, and 64f being separated from the connection bars 68. When the third, fourth, and sixth rings 64c, 64d, and 64f are separated from the connection bars 68, third, fourth, and sixth spray ports 65c, 65d, and 65f corresponding to the third, fourth, and sixth rings 64c, 64d, and 64f are provided. That is, it is possible to selectively provide the first to sixth spray ports 65a, 65b, 65c, 65d, 65e, and 65f by selectively separating the first to sixth rings 64a, 64b, 64c, 64d, 64e, and 64f from the connection bars 68, thereby controlling the flow of the plasma to be supplied to the support plate 20 and thus securing process uniformity.

Meanwhile, for example, the fourth ring 64d may be divided, at predetermined angular intervals (for example, 120 degrees) about the central plate 62, into several pieces, and some pieces of the fourth ring 64d may be selectively separated from the other pieces of the fourth ring 64d to change the flow of the plasma. This structure generally coincides with the description previously given in connection with the first and second exhaust plates 32 and 34.

Figure 11:
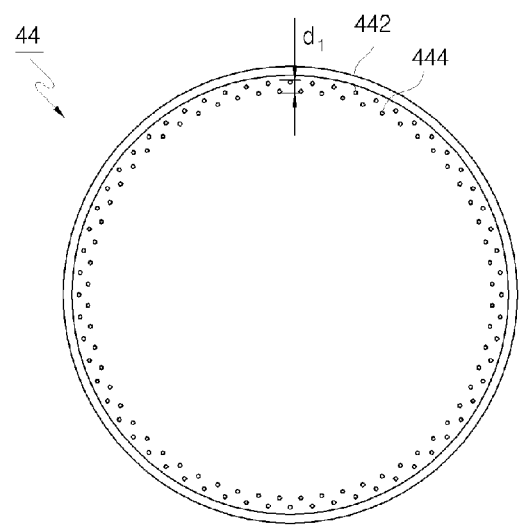
FIGS. 11 and 12 are views illustrating a diffusion plate of FIG. 1.
Figure 12:
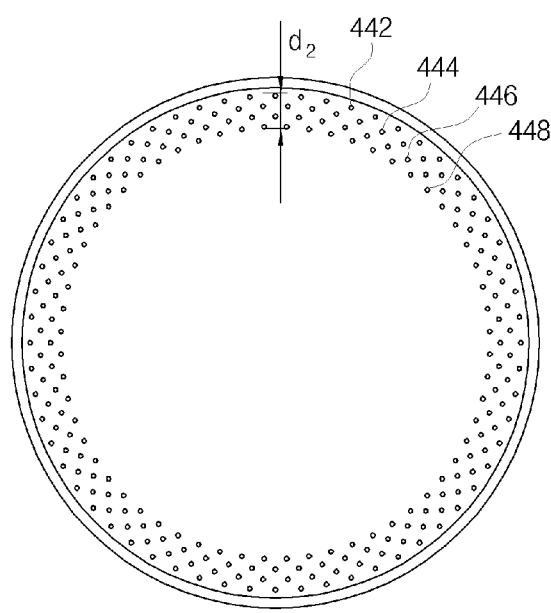

FIGS. 11 and 12 are views illustrating the diffusion plate 44 of FIG. 1.

The diffusion plate 44 shown in FIG. 11 has first diffusion holes 442 located at the outermost side thereof and second diffusion holes 444 located inside the first diffusion holes 442. The first and second diffusion holes 442 and 444 are disposed within a predetermined width d1. The diffusion plate 44 shown in FIG. 12 has third and fourth diffusion holes 446 and 448 in addition to the first and second diffusion holes 442 and 444. The first to fourth diffusion holes are disposed within a predetermined width d2.

A source gas introduced through the supply line 42 is diffused into the generation chamber 14 through the diffusion holes. At this time, it is possible to change a method of supplying the source gas by changing the arrangement of the diffusion holes and to control process uniformity according to the method of supplying the source gas.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

INDUSTRIAL APPLICABILITY

Apparent from the above description, it is possible to control exhaust, thereby securing process uniformity. Consequently, the present invention has industrial applicability.

The invention claimed is:

1. A substrate processing apparatus comprising:
   a chamber having an inner space where a process is carried out with respect to a substrate;
   a support member disposed in the chamber for supporting the substrate; and
   an exhaust unit for exhausting substance in the inner space to the outside,
   wherein the exhaust unit comprises:
      a first exhaust plate located at an upstream of an exhaust path of the substance, the first exhaust plate having a first opening in which the support member is installed and a plurality of first exhaust holes that are arranged to surround the first opening, the substance being exhausted through the first exhaust holes;
      a second exhaust plate located at a downstream of the exhaust path, the second exhaust plate having a second opening in which the support member is installed and a plurality of second exhaust holes that are arranged to surround the second opening, the substance being exhausted through the second exhaust holes;
      a plurality of first covers being separated from each other, some of the first covers being removed from the top surface of the first exhaust plate, respectively, to open some of the first exhaust holes so that the substance can be exhausted through some of the first exhaust holes, the remaining first covers being coupled to the top surface of the first exhaust plate, respectively, to close the remaining first exhaust holes so that the substance cannot be exhausted through the remaining first exhaust holes, in order that the uniformity of the process can be secured; and
      a plurality of second covers being separated from each other, some of the second covers being removed from the top surface of the second exhaust plate, respectively, to open some of the second exhaust holes so that the substrate can be exhausted through some of the second exhaust holes, the remaining second covers being coupled to the top surface of the second exhaust plate, respectively, to close the remaining second exhaust holes so that the substance cannot be exhausted through the remaining second exhaust holes, in order that the uniformity of the process can be secured,
   wherein the first exhaust holes comprise: first inside exhaust holes arranged on a concentric circle about a center of the first exhaust plate; and first outside exhaust holes disposed outside the first inside exhaust holes, the first outside exhaust holes being arranged on another concentric circle about the center of the first exhaust plate, wherein the second exhaust holes comprise: second inside exhaust holes arranged on a concentric circle about a center of the second exhaust plate; and second outside exhaust holes disposed outside the second inside exhaust holes, the second outside exhaust holes being arranged on another concentric circle about the center of the second exhaust plate.

2. The substrate processing apparatus according to claim 1 wherein the first exhaust plate is disposed outside the support member, and the second exhaust plate is disposed below the first exhaust plate generally in parallel to the first exhaust plate.

3. The substrate processing apparatus according to claim 1, further comprising: a gas supply unit for supplying a source gas into the inner space; and a coil for inducing an electric field in the inner space to generate plasma from the source gas.

4. The substrate processing apparatus according to claim 3, further comprising: a guide tube disposed above the support member for concentrating the plasma generated in the inner space on the support member.

5. The substrate processing apparatus according to claim 4, wherein the guide tube has a sectional shape generally corresponding to the shape of the substrate.

6. The substrate processing apparatus according to claim 3, wherein the chamber comprises: a process chamber in which the support member is disposed, the process chamber being configured such that the process is carried out by the plasma in the process chamber; and a generation chamber disposed above the process chamber, the generation chamber being configured such that the plasma is generated by the coil in the generation chamber, the guide tube extending from a top wall of the process chamber to a bottom wall of the process chamber.

7. The substrate processing apparatus according to claim 3, wherein the chamber comprises: a process chamber in which the support member is disposed, the process chamber being configured such that the process is carried out by the plasma in the process chamber; and a generation chamber extending upward from a top wall of the process chamber, the generation chamber being configured such that the plasma is generated by the coil in the generation chamber, the guide tube extending from a side wall of the generation chamber to a bottom wall of the process chamber.

8. The substrate processing apparatus according to claim 1, further comprising: a gas supply unit for supplying a source gas into the inner space; a coil for inducing an electric field in the inner space to generate plasma from the source gas; a showerhead disposed above the support member in parallel to the support member for supplying the plasma to the substrate placed on the support member; and a support frame for fixing the showerhead to a top of the support member.

9. The substrate processing apparatus according to claim 8, wherein the first exhaust plate is disposed outside the support member, and the support frame is installed on the first exhaust plate.

10. The substrate processing apparatus according to claim 4, wherein the chamber comprises: a process chamber in which the support member is disposed, the process chamber being configured such that the process is carried out by the plasma in the process chamber; and a generation chamber disposed above the process chamber, the generation chamber being configured such that the plasma is generated by the coil in the generation chamber, the guide tube extending from a top wall of the process chamber to a bottom wall of the process chamber.

11. The substrate processing apparatus according to claim 5, wherein the chamber comprises: a process chamber in which the support member is disposed, the process chamber being configured such that the process is carried out by the plasma in the process chamber; and a generation chamber disposed above the process chamber, the generation chamber being configured such that the plasma is generated by the coil in the generation chamber, the guide tube extending from a top wall of the process chamber to a bottom wall of the process chamber.

12. The substrate processing apparatus according to claim 4, wherein the chamber comprises: a process chamber in which the support member is disposed, the process chamber being configured such that the process is carried out by the plasma in the process chamber; and a generation chamber extending upward from a top wall of the process chamber, the generation chamber being configured such that the plasma is generated by the coil in the generation chamber, the guide tube extending from a side wall of the generation chamber to a bottom wall of the process chamber.

13. The substrate processing apparatus according to claim 5, wherein the chamber comprises: a process chamber in which the support member is disposed, the process chamber being configured such that the process is carried out by the plasma in the process chamber; and a generation chamber extending upward from a top wall of the process chamber, the generation chamber being configured such that the plasma is generated by the coil in the generation chamber, the guide tube extending from a side wall of the generation chamber to a bottom wall of the process chamber.

* * * * *